United States Patent
Pasotti et al.

(10) Patent No.: US 7,251,705 B2
(45) Date of Patent: Jul. 31, 2007

(54) EMBEDDABLE FLASH MEMORY SYSTEM FOR NON-VOLATILE STORAGE OF CODE, DATA AND BIT-STREAMS FOR EMBEDDED FPGA CONFIGURATIONS

(75) Inventors: Marco Pasotti, San Martino Siccomario (IT); Michele Borgatti, Finale Emilia (IT); Pier Luigi Rolandi, Monleale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 455 days.

(21) Appl. No.: 10/768,743

(22) Filed: Jan. 29, 2004

(65) Prior Publication Data

US 2005/0005055 A1    Jan. 6, 2005

(30) Foreign Application Priority Data

Jan. 31, 2003  (EP) .................................. 03425057

(51) Int. Cl.
*G06F 12/00* (2006.01)
(52) U.S. Cl. .................................. 711/103; 365/185.01
(58) Field of Classification Search ................ 711/103; 365/185.01, 185.05
See application file for complete search history.

(56) References Cited

U.S. PATENT DOCUMENTS

| 5,693,570 | A  | * | 12/1997 | Cernea et al. .............. 438/107 |
| 5,889,303 | A  | * | 3/1999  | Eckert et al. ............... 257/316 |
| 6,172,931 | B1 |   | 1/2001  | Cha et al. ................... 365/226 |
| 6,178,129 | B1 |   | 1/2001  | Chen ........................... 365/206 |
| 6,330,185 | B1 | * | 12/2001 | Wong et al. .......... 365/185.03 |
| 6,467,009 | B1 |   | 10/2002 | Winegarden et al. ....... 710/305 |
| 6,473,321 | B2 | * | 10/2002 | Kishimoto et al. ........... 363/59 |
| 2003/0006742 | A1 | * | 1/2003 | Jahanshir et al. ........... 323/282 |
| 2003/0154430 | A1 | * | 8/2003 | Allen et al. .................... 714/45 |
| 2004/0201414 | A1 | * | 10/2004 | Pasotti et al. ............... 327/519 |

FOREIGN PATENT DOCUMENTS

| EP | 0 838 823 A2 | 4/1998 |
| EP | 1 274 091 A1 | 1/2003 |

* cited by examiner

*Primary Examiner*—Woo H. Choi
(74) *Attorney, Agent, or Firm*—Lisa K. Jorgenson; E. Russell Tarleton; Seed IP Law Group PLLC

(57) ABSTRACT

An application-specific embeddable flash memory having three content-specific I/O ports and delivering a peak read throughput of 1.2 GB/s. The memory is combined with a special automatic programming gate voltage ramp generator circuit having a programming rate of 1 Mbyte/s for non-volatile storage of code, data, and embedded FPGA bit stream configurations. The test chip uses a NOR-type 0.18 μm flash embedded technology with 1.8V power supply, two poly, six metal and memory cell size of 0.35 μm².

15 Claims, 7 Drawing Sheets

EMBEDDABLE FLASH MEMORY SYSTEM FOR NON-VOLATILE STORAGE OF CODE, DATA AND BIT-STREAMS FOR EMBEDDED FPGA CONFIGURATIONS

BACKGROUND OF THE INVENTION

1. Field of the Invention

The present invention relates to an embeddable Flash memory system for non-volatile storage of code, data, and bit-streams for embedded FPGA configurations. More specifically, the invention relates to a memory system integrated into a single chip together with a microprocessor and including a modular array structure comprising a plurality of memory blocks.

2. Description of the Related Art

As is well known in this specific technical field, the continuous size and price reduction in hand-held digital equipment together with demanding computing performance and low power constraint for consumer applications is increasing the need for a technology that combines high performance digital CMOS transistor and non-volatile flash memory.

For instance, an efficient power block for a memory device is disclosed in the article by R. Pelliconi, D. Iezzi, A. Baroni, M. Pasotti, P. L. Rolandi, "Power efficient charge pump in deep sub micron standard CMOS technology," Proceedings of 27th ESSCIRC, pp100-103, September 2001.

At the same time raising costs of mask sets and shorter time-to-market available for new products are leading to the introduction of systems with a higher degree of programmability and configurability, such as system-on-chip with configurable processors, embedded FPGA, and embedded flash memory.

In this respect, the availability of an advanced embedded flash technology, based on NOR architecture, together with innovative IP's, like embedded flash macrocells with special features, is a key factor.

For a better understanding of the present invention reference is made to the Field Programmable Gate Array (FPGA) technology combining standard processors with embedded FPGA devices.

These solutions enable configuration of the FPGA at deployment time with exactly the required peripherals, exploiting temporal re-use by dynamically reconfiguring the instruction-set at run time based on the currently executed algorithm.

The existing models for designing FPGA/processor interaction can be grouped in two main categories:
 the FPGA is a co-processor communicating with the main processor through a system bus or a specific I/O channel;
 the FPGA is described as a functional unit of the processor pipeline.

The first group includes the GARP processor, known from the article by T. Callahan, J. Hauser, and J. Wawrzynek entitled: "The Garp architecture and C compiler" IEEE Computer, 33(4):62-69, April 2000. A similar architecture is provided by the A-EPIC processor that is disclosed in the article by S. Palem and S. Talla entitled: "Adaptive explicit parallel instruction computing", Proceedings of the fourth Australasian Computer Architecture Conference (ACOAC), January 2001.

In both cases the FPGA is addressed via dedicated instructions, moving data explicitly to and from the processor. Control hardware is kept to a minimum, since no interlocks are needed to avoid hazards, but a significant overhead in clock cycles is required to implement communication.

Only when the number of cycles per execution of the FPGA is relatively high may the communication overhead be considered negligible.

In the commercial world, FPGA suppliers such as Altera Corporation offer digital architectures based on U.S. Pat. No. 5,968,161, issued to T. J. Southgate, entitled: "FPGA based configurable CPU additionally including second programmable section for implementation of custom hardware support".

Other suppliers (Xilinx, Triscend) offer chips containing a processor embedded on the same silicon IC with embedded FPGA logic. See for instance U.S. Pat. No. 6,467,009, issued to S. P. Winegarden et al., entitled: "Configurable Processor System Unit", and assigned to Triscend Corporation.

However, those chips are generally loosely coupled by a high speed dedicated bus, performing as two separate execution units rather than being merged in a single architectural entity. In this manner the FPGA does not have direct access to the processor memory subsystem, which is one of the strengths of the academic approaches outlined above.

In the second category (FPGA as a function unit) we find architectures commercially known as: "PRISC"; "Chimaera" and "ConCISe".

In all these models, data are read and written directly on the processor register file, minimizing overhead due to communication. In most cases, to minimize control logic and hazard handling and to fit in the processor pipeline stages, the FPGA is limited to combinatorial logic only, thus severely limiting the performance boost that can be achieved.

These solutions represent a significant step toward a low-overhead interface between the two entities. Nevertheless, due to the granularity of FPGA operations and its hardware-oriented structure, their approach is still very coarse-grained, reducing the possible resource usage parallelism and again including hardware issues not familiar nor friendly to software compilation tools and algorithm developers.

Thus, a relevant drawback in this approach is often the memory data access bottleneck that often forces long stalls on the FPGA device in order to fetch on the shared registers enough data to justify its activation.

BRIEF SUMMARY OF THE INVENTION

The invention overcomes the limitations of similar preceding architectures by relying on a embedded device of a novel nature and a new design for processor/memory interface.

According to a first embodiment of the present invention, the embeddable Flash memory system includes a modular array structure having a plurality of memory blocks, wherein a power block, including charge pumps, is shared among different flash memory modules through a PMA arbiter in a multi-bank fashion.

Moreover, the embeddable Flash memory system according to the invention includes three different access ports, each for a specific function:
 a code port CP (10) optimized for random access time and the application system;
 a data port DP (11) allowing an easy way to access and modify application data; and, an FPGA port FP (12) offering a serial access for fast download of bit streams for an embedded FPGA (e-FPGA) configurations.

In accordance with another embodiment of the invention, a memory system is provided that includes: a memory module, the memory module including a non-volatile memory block, a power block, and a power management arbiter coupling the power block to the non-volatile memory block, the arbiter configured to provide charge pump sharing among flash memory modules in the non-volatile memory block from a single charge pump in the power block.

In accordance with another aspect of the present invention, a memory system is provided that includes a plurality of non-volatile flash memory blocks; a power block comprising a plurality of charge pumps; a power management arbiter coupled to the power block and to the non-volatile flash memory blocks, the power management arbiter including a programming circuit configured to couple the charge pumps to the memory blocks and an order block configured to order requests for the memory blocks; a crossbar coupled to the memory blocks, power block, and power management arbiter; a code port coupled to the crossbar and configured to optimize random access time and to manage application code stored in the memory blocks; a data port coupled to the crossbar and configured to provide access to and modify application data stored in the memory blocks; a floating programmable gate array port coupled to the crossbar and configured to provide serial access for download of bit streams of embedded floating programmable gate array configurations stored in the memory modules; and a microprocessor coupled to the crossbar and configured to provide data management and memory system testing.

In accordance with another aspect of the foregoing embodiment, the memory system further includes the order block being configured to order requests for the memory blocks in accordance with the following rules: status of the request (already active or new request); and priority information; and it preferably includes the power management arbiter having a switch block coupled to an output of the order block and configured to manage requests of the memory blocks in response to output of the order block; and a request decoder block configured to enable the charge pumps; and a pump driver block configured to manage power down/stand-by timeout and to limit requests for each charge pump to a maximum allowed number of requests.

Thus, the disclosed embodiments of the present invention provide a new embeddable memory architecture having functional and structural features capable of achieving significant performance and energy consumption enhancements with respect to a traditional signal processing device.

BRIEF DESCRIPTION OF THE DRAWINGS

The features and advantages of the digital architecture according to this invention will become apparent from the following description of a best mode for carrying out the invention given by way of non-limiting example with reference to the enclosed drawings, wherein.

DETAILED DESCRIPTION OF THE INVENTION

Figure 1:
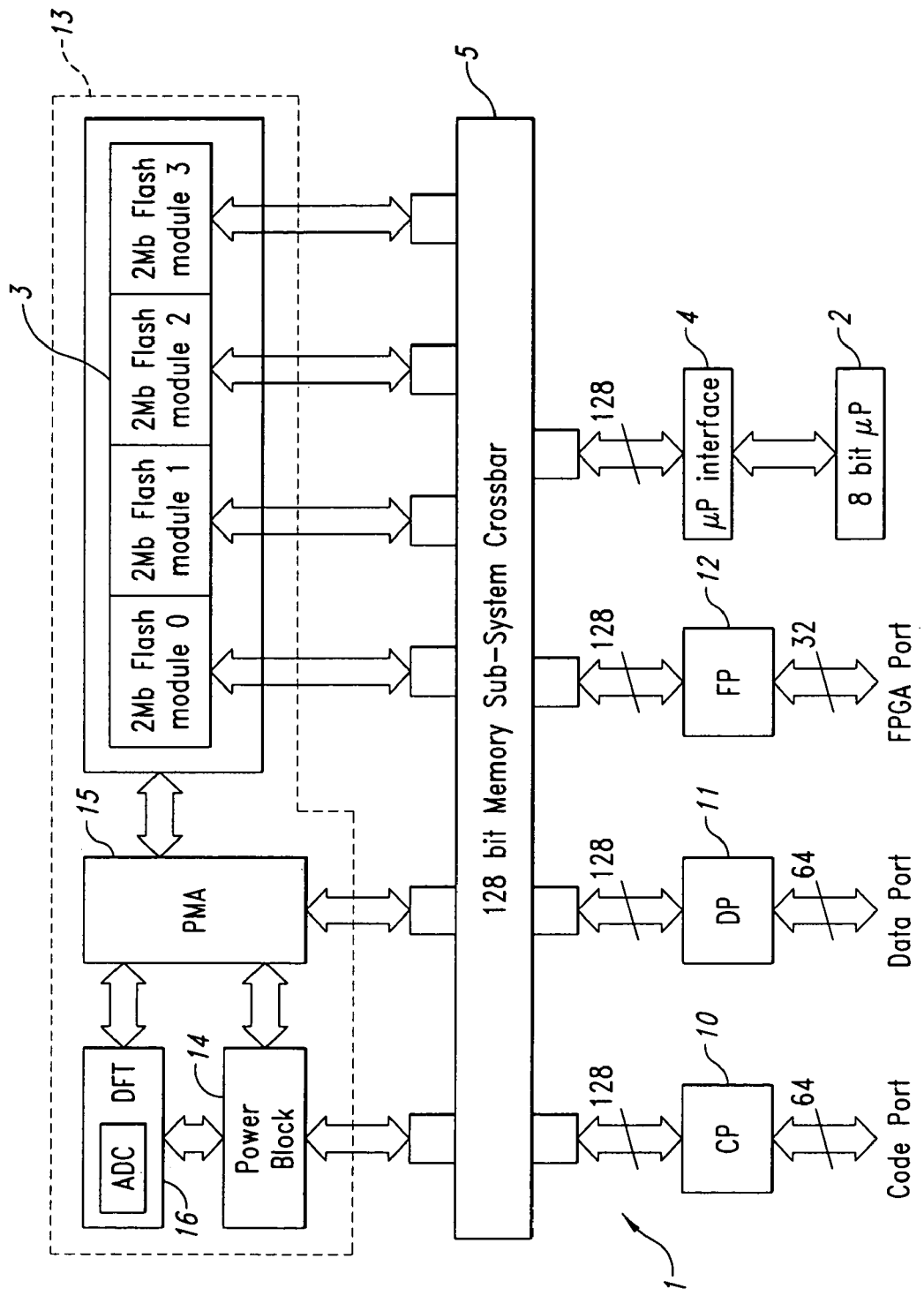
FIG. 1 is a block diagram of a memory architecture for data storage processing according to the present invention.

With reference to the drawings views, generally shown in FIG. 1 is an embeddable Flash memory system 1 for non-volatile storage of code, data and bit-streams for embedded FPGA configurations realized according to one embodiment of the present invention.

More specifically, an 8Mb application-specific embeddable flash memory system is disclosed. The memory system may be integrated into a single chip together with a microprocessor 2.

This memory architecture 1 includes three different access ports, each for a specific function:
  a code port 10 (CP), which is optimized for random access time and the application system; this port 10 may be used as in a usual flash memory;
  a data port 11 (DP) allowing an easy way to access and modify application data; and,
  an FPGA port 12 (FP) offering a serial access for a fast download of bit streams for embedded FPGA (e-FPGA) configurations.

A test chip will be further presented that is integrated for performance assessment as well as for design and built-in self-test methodology validation. A special automatic programming gate voltage ramp generator circuit that allows a programming rate of 1 Mbyte/s and an erase time of 200 ms is also introduced, as will be further clarified.

The memory system architecture 1 is schematically shown in FIG. 1. The architecture comprises a modular memory 13 (dotted line) including charge pumps 14 (Power Block), testability circuits 16 (DFT), a power management arbiter 15 (PMA) and a customizable array of N independent 2 Mb flash memory modules 3.

Depending on the storage requirements and performances, the number of modules 3 can be varied. In the current non-limiting example the number of modules has been chosen as N=4.

The modular memory 13 includes (N+2) 128-bit target ports and implements a N-bank uniform memory.

As previously mentioned, three content-specific ports 10, 11 and 12 are dedicated to code (CP, 64-bit wide), data (DP, 64-bit), and FPGA bit stream configurations (FP, 32-bit). A 128 bit sub-system crossbar 5 connects all the architecture blocks and the eight bit microprocessor 2.

The main features of such a flash memory system are: charge pump 14 sharing among different flash memory modules 3 through the PMA arbiter 15 in a multi-bank fashion. Moreover, the use of a small eight-bit micro processor 2 provides easy memory system testing and adds complex functionalities for data management, and the use of an ADC (Analog-to-Digital Converter), required by the application, increases the self-test capability of the system.

Below is an evaluation in more detail of the main features of the inventive memory architecture.

Each flash memory module 3 has a size of 2 Mb and has a 128-bit 10 data bus with 40 ns access time, resulting in 400 Mbyte/s overall throughput, and a program/erase control unit.

All the high-voltage generation section is in the power block 14, which is shared by each of the four 2 Mb flash memory modules 3.

A 1 Mbyte/s programming rate with 128 bit word requires that the programming charge pumps of the block 14 be able to supply up to 3 mA of programming current.

These charge pumps are usually sized to sustain operations in worst case conditions of process and temperature variations with all bits of a word in programming. This leads to an increase in the charge pump area of more than 130% with respect to typical conditions, when just half of the bits in a word will be programmed.

Figure 2:
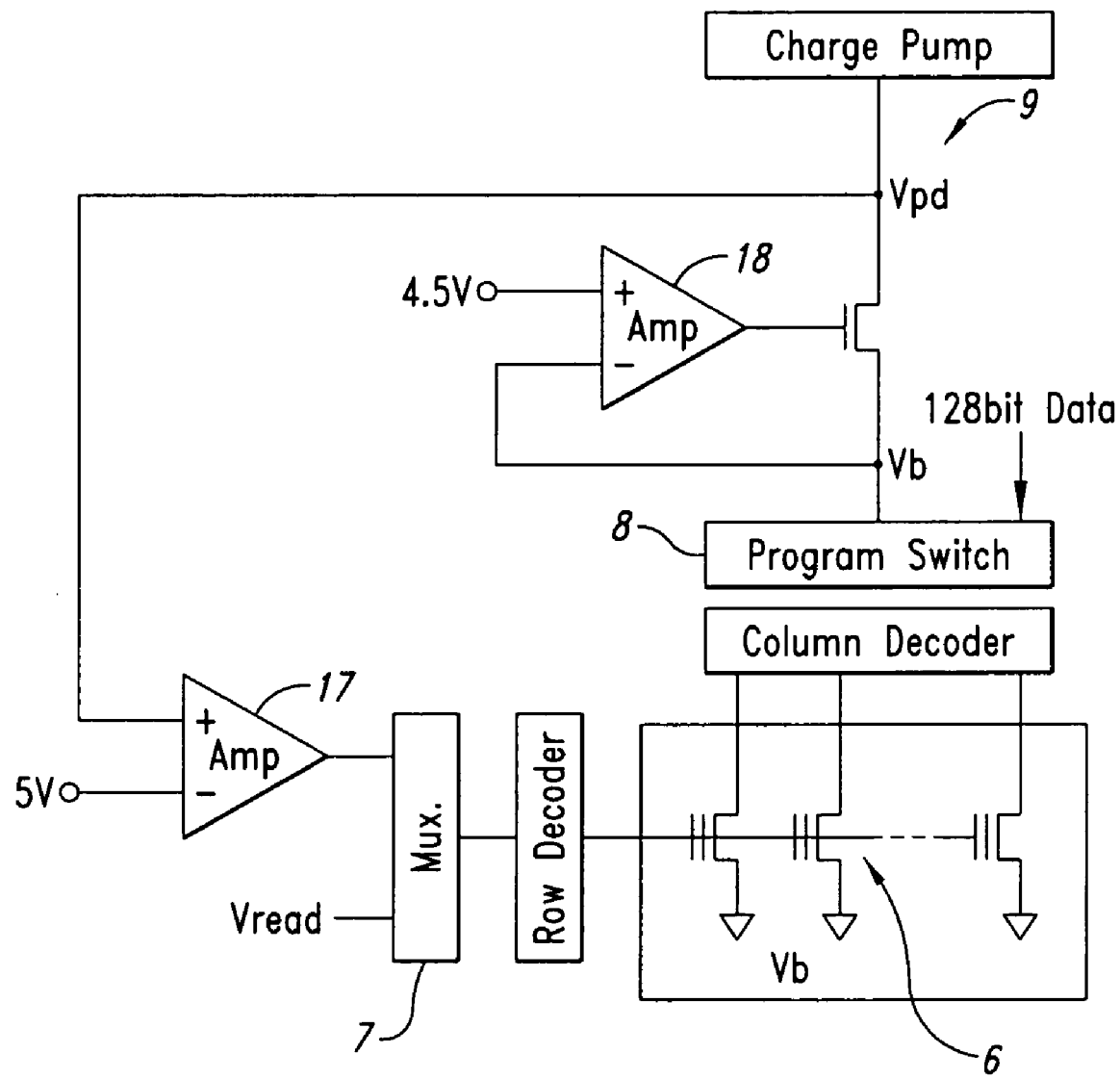
FIG. 2 is a block diagram of a programming circuit with a gate ramp slope dependent on current required by memory cells under programming.

This memory architecture further includes a programming circuit 9 that overcomes this problem and is shown in FIG. 2.

As may be appreciated, the memory cells 6 are organized in a memory matrix with associated row and column decoders. A multiplexer 7, fed by the output of a voltage regulator 17, will bias the memory matrix rows with a Vread voltage, while a program switch 8 fed by another voltage regulator 18 will bias the memory matrix columns with a Vd voltage generated through a Vpd voltage value supplied by the charge pumps.

Figure 3:
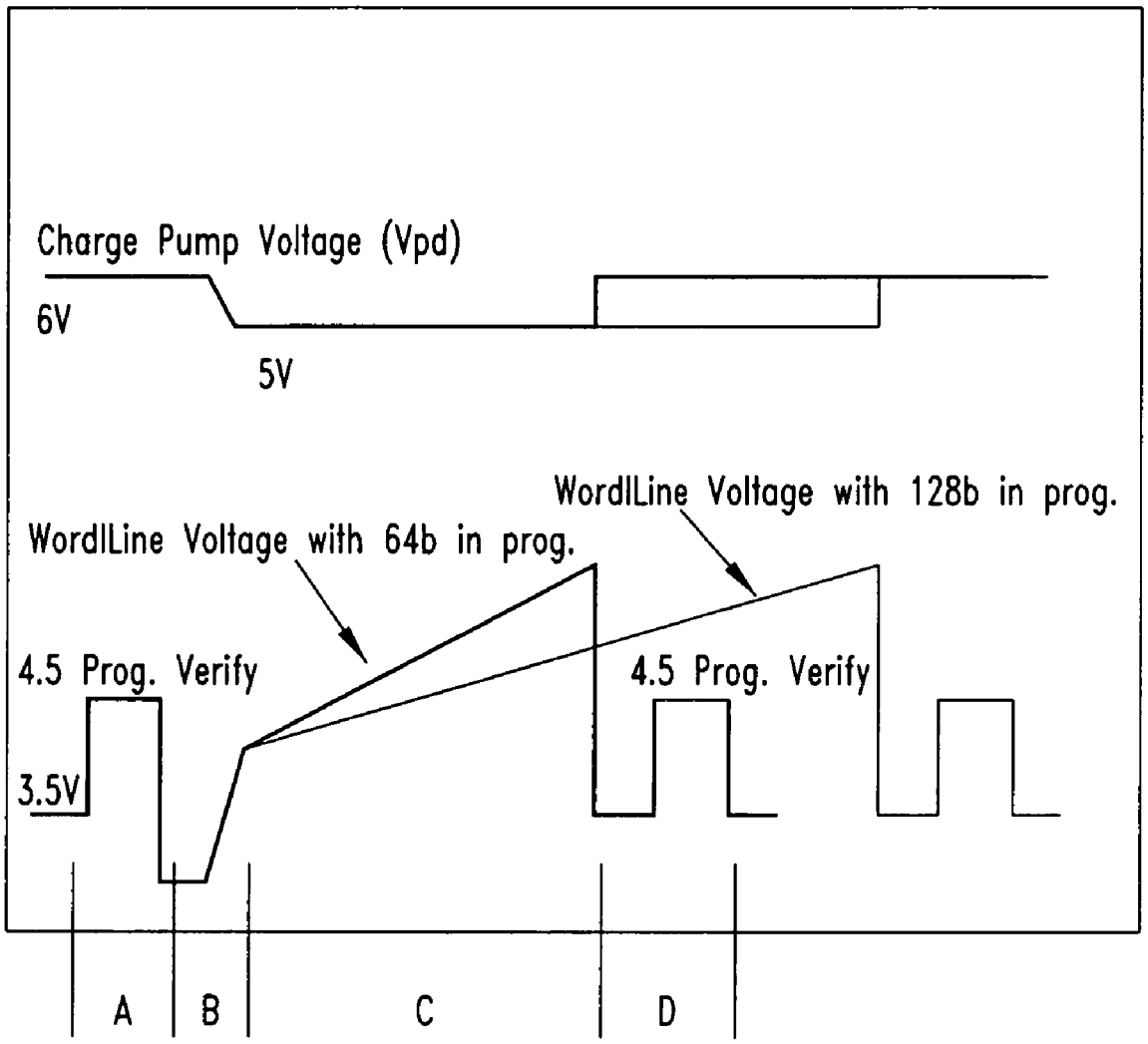
FIG. 3 is a schematic diagram of programming gate voltage ramp slope with 128 cells in programming (0.3 V/us)
Figure 4:
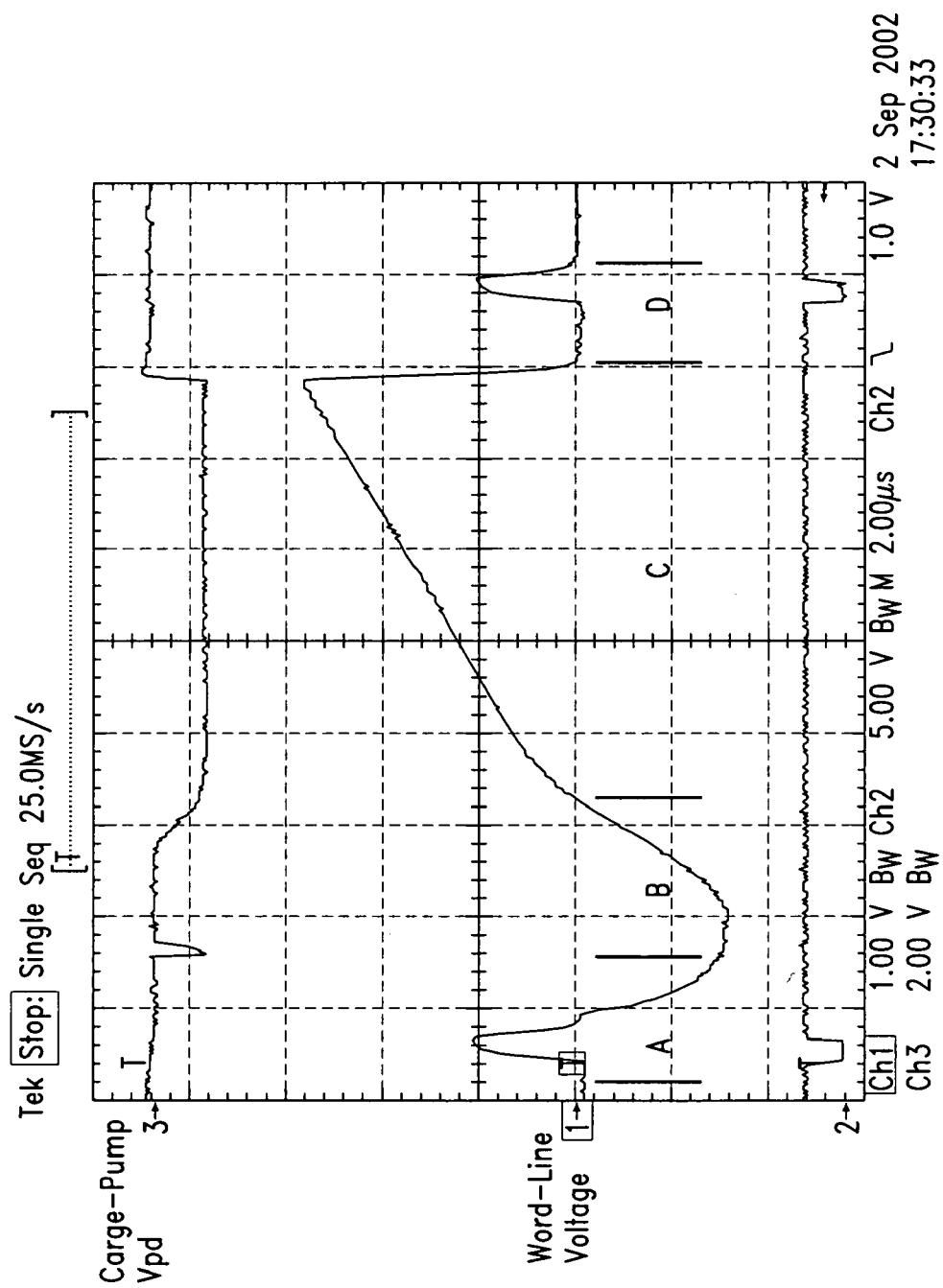
FIG. 4 is the real diagram of the voltage ramp slope of FIG. 3.

Referring now to FIGS. 3 and 4, after a preliminary program verify operation, phase A, the programming operation starts in phase B. The programming circuit 9 will move the gate voltage with a maximum slope defined by the operational amplifier slew-rate, until the memory cells sink all the available current.

In a third phase C, the gate voltage reaches a level that switches on all the cells in programming and the charge pump output voltage Vpd lowers from 6V to 5V.

The operational amplifier changes the word-line voltage slope to fix the voltage Vpd at that voltage value where the charge pump can deliver current at maximum efficiency.

This current programs the flash cells 6 through the voltage regulator 18, which keeps the flash cell drain voltage Vd at a fixed value of 4.5V.

In phase C, all the cells 6 under programming will see their thresholds moving at the same rate and the generated programming gate voltage becomes a linear ramp, at first order, with an optimum slope defined by the current from the charge pump and by the number of bits in programming, enabling the memory cells 6 to use all the available current, while modulating the programming gate voltage and, consequently, the programming speed.

As application data are supposed to be frequently modified, erased, and programmed, threshold distributions have been carefully positioned taking into account this assumption together with reliability and power consumption considerations.

When a memory cell 6 is programmed or erased, power is consumed to move its threshold from the erased state to the programmed state, or from the programmed state to the erased state. The higher the voltage separating the two states, the more power is consumed to change the state of the cell.

With erased and programmed states voltage distance of about 2V and using an accurate sense amplifier, good reliability and power consumption performances can be obtained because programming and erasing algorithms are rapidly converging.

In typical conditions, when 64 bits are programmed out of 128 bits, a programming time of less then 16 ns is obtained. FIG. 4 is a real diagram showing the worst case program operation of when all 128 bits of a word are programmed. As may be appreciated, it is completed in just one programming pulse even when the gate programming voltage reaches a relatively low voltage (~6V) and a total programming time of ~18 ns for 16 bytes is obtained.

The erasing function takes full advantage from the programming circuit accelerating the soft-programming phase, and using large parallelism it is possible to have very short verify phases. A sector is erased in typically 200 ms.

Figure 5:
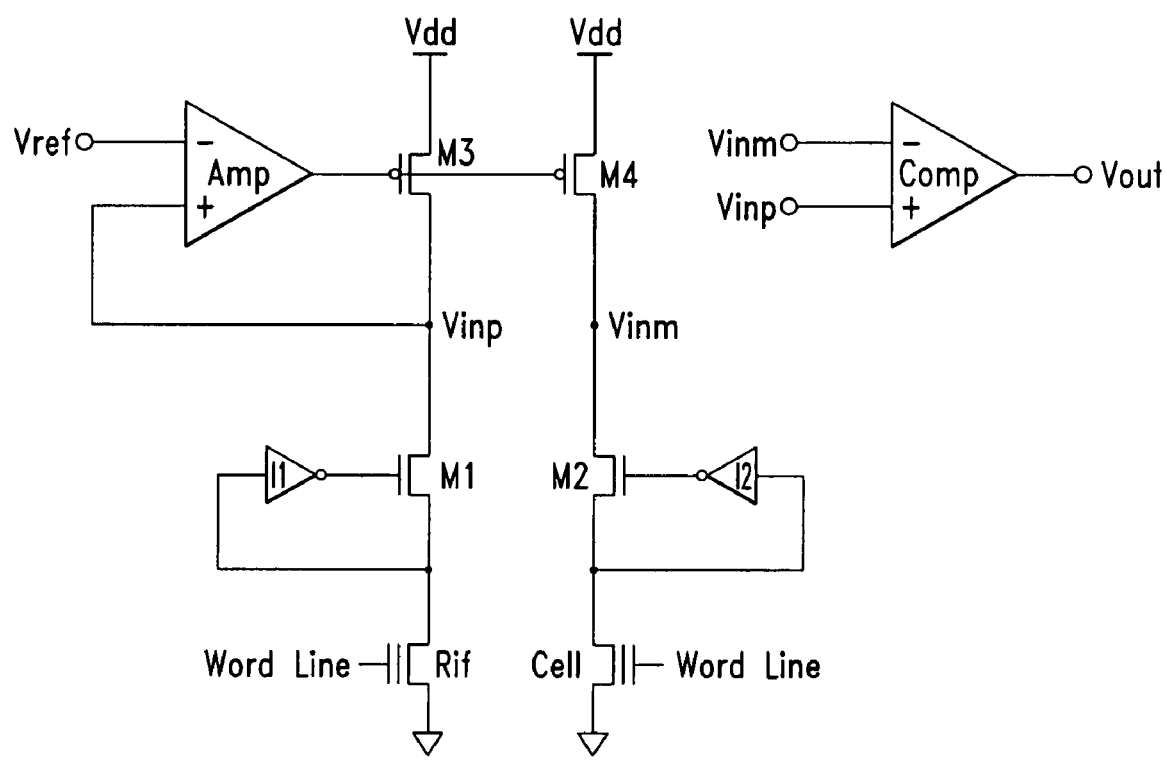
FIG. 5 is a block diagram of a sense amplifier.

The sense amplifier shown in FIG. 5 is of a known type and is able to operate down to 1.5V. This closed loop circuit enhances precision and current/voltage gain as needed to work with closer thresholds margins. A 40 ns access time is obtained, or 400 Mbyte/s read rate, which allows a 32 bit processor to run at up to 100 MHz.

The memory system 1 includes four 2 Mbit flash memory modules 3 that can be requested to perform one of three operations (read, write, erase) at the same time and independently. Simultaneous memory operations use the power management arbiter block 15 (PMA) for optimal scheduling.

Available power and user-defined priorities are considered to schedule conflicting resource requests in a single clock cycle.

Remembering that the write operation is composed by two different basic operations, program pulse and verify (a sequence that can be repeated), while the erase operation is composed by three different basic operations, erase pulse, verify (erase verify and depletion verify) and soft-program, each time a flash memory module enters a new basic operation, it sends a request to the PMA arbiter block 15 for all the needed high voltages allocation.

Read and verify are the only operations allowed to occur at the same time in the four flash memory modules 3, while the basic program pulse and basic erase pulse operations can be performed in just one memory module 3 at a time.

Figure 6:
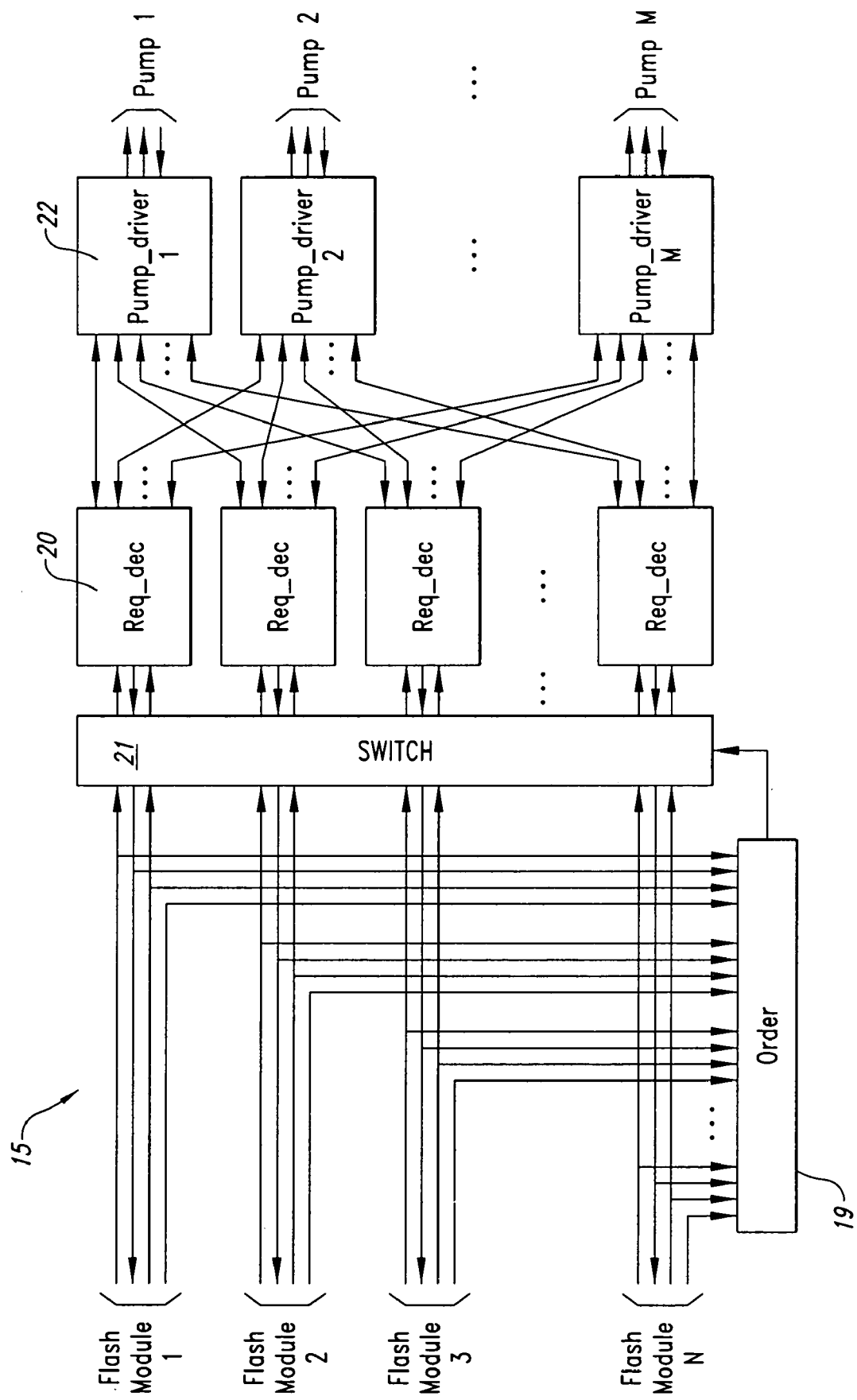
FIG. 6 is a block diagram of a power management block architecture.

The main component of the PMA arbiter block 15, shown in FIG. 6, is the order block 19. It orders the requests for the memory modules 3, following these rules:

status of the request (already active or new request); priority information.

The requests are collected and processed in parallel by three stages: encoders, comparators, and one level of logic. The response is available in only one clock cycle.

Referring to FIG. 6, a switch block 21 satisfies the requests of the flash memory modules 3 based on the order block 19 output. A request decoder is provided, block 20 req_dec, for enabling the required high voltage resources (charge pumps 14) while a corresponding pump driver block 22 manages the power down/stand-by timeout and limits the requests for each resource to the maximum allowed.

The correspondence between requests and high voltage resources, power down and standby time, and the maximum number of parallel requests that is possible to satisfy are configurable.

The function of the three ports 10, 11 and 12 will be described in detail.

The first port 10 is dedicated to manage application code stored in flash memory modules. It has also the possibility to write in the memory areas for DP, to perform memory formatting, and FP, to store downloading configurations.

The code port CP 10 has four configuration registers defining its addressable memory space: two at the application level, and two at the flash memory modules level.

The I/O data word bus is 64 bits wide, while the address bus is 32 bits.

The port uses one chip select to access in the addressable memory space. During operations (read and write), the port acts as a conventional RAM memory, using a write enable in case of write operation. As this port allows the erase operation, which is necessary before a write operation in a flash memory modules, an erase enable input signal has been added.

During a read operation, an output ready signal is tied low when data are not available immediately, so that it can acts as a wait state signal.

The second data port DP 11 is dedicated to manage application data stored in flash memory modules, eventually organized in a file system by the application, using a typical data page of 512B.

The DP has four configuration registers defining its addressable memory space: two at the application level, and two at the flash memory modules level.

The I/O data word bus is 64 bits wide, while the address bus is 32 bits.

Functions are offered to give the application the possibility to implement a file system for data management.

The operations available are Read Page, Read Word, Write Page, Invalid Page and Defragmentation. A 512B SRAM page buffer allows the application to exchange data in burst mode at maximum speed to increase performance especially during write operation.

The erase operation is not available because it is hidden by the micro controller 2 that does a logic remapping of physical address.

Furthermore in Write Page, the physical address is chosen using an algorithm that takes into account the filling status of sectors. If there are full sectors with an invalid page, a defragmentation operation is automatically started to increase free space, and sectors are eventually erased during this operation.

A Port Status Register is available and can be directly read in order to get information about the status of current operations.

The third FP port 12 is dedicated to manage embedded-FPGA (e-FPGA) configurations data stored in flash memory modules. The FP port is read-only and provides fast sequential access for bit streams downloading.

The FP has four configuration registers replicating the information stored in the CP port 11 that must be used in order to write e-FPGA configurations data.

The output data word bus and the address bus are 32 bits wide. The FP port 12 uses a chip select to access in the addressable memory space, and a burst enable to allow burst serial access.

In read operation, an output ready signal is tied low when data are not immediately available, so that it can act as a wait state signal.

The eight-bit microprocessor 2 (uP) performs additional complex functions (defragmentation, compression, virtual erase, etc.) not natively supported by the DP port 11, and assists in a built-in self test of the memory system. The (N+2)×4 128-bit crossbar 15 connects the modular memory with the four initiators (CP, DP, FP and uP) providing that the three and preferably four flash memory modules 3 can be read in parallel at full speed.

The memory space of the four flash memory modules 3 is arranged in three programmable user-defined partitions, each one devoted to a port. The memory system clock can run up to 100 MHz, and reading three modules 3 with 128 bit data bus and 40 ns access time, results in a peak read throughput of 1.2 GB/s.

The overall system testability is enhanced by the specific DFT block 16 connected to all relevant internal signals. It makes use of an external high voltage power supply, while access from the external test equipment is granted by two analog IO pads (not shown).

By means of external analog references, the DFT block 16 can first test its own circuitry and then all internally generated voltages and currents that are vital for the correct system operations (e.g., band gap voltage, regulated voltages, charge pumps).

The measurement capability of the component can be profitably applied to the trimming of analog internal signals, so that also the following operations can be implemented:

reference flash cell current measurement and calibration;
voltage and current reference calibration;
threshold voltage (as obtained by an analog sense amplifier) measurement of memory cells.

See, for example, the article by P. L. Rolandi et al., "1M-cell 6b/cell analog flash memory for digital storage", ISSCC 1998 Digest of Technical Papers, pp 334-335, February 1998.

The test flux is controlled by the microprocessor 2 present in the system.

The main components of the DFT block 16 are a network of analog switches, multiplexers, a charge integrator, a voltage attenuator, a comparator and a ten bit pipeline ADC (Analog-to-Digital Converter).

The two analog IO pads have the main function to provide external references for the measurements. But they also allow, by means of the analog switches network, a wide direct detectability of internal nodes under test in the system.

The voltage path to the ADC is fully differential, yielding advantages in terms of power supply noise rejection.

Figure 7:
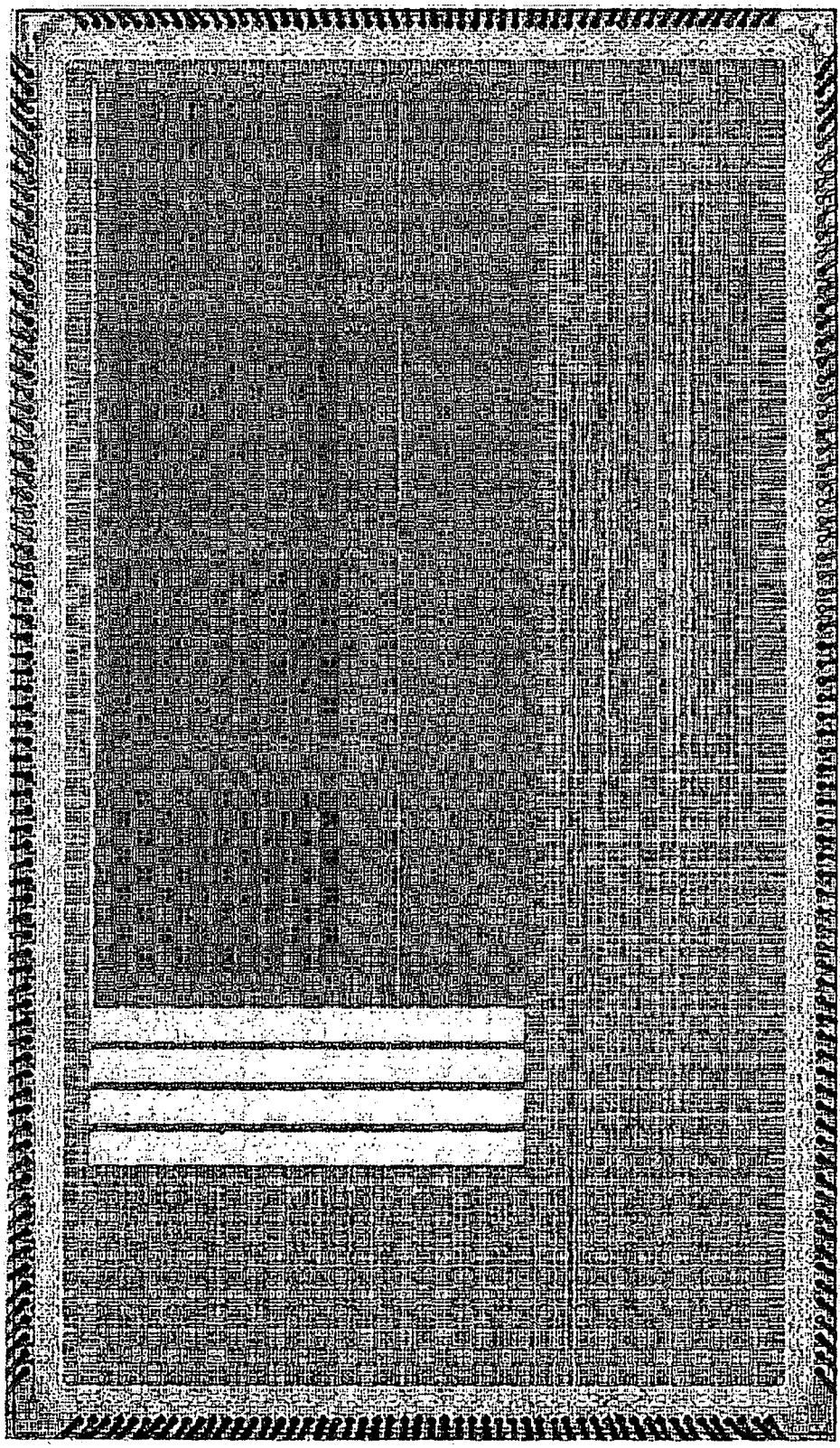
FIG. 7 is a representation of a photograph of the memory architecture according to the present invention.

Hereinafter, Table I resumes the technology parameters and device performance of the inventive memory architecture, while in FIG. 7 it is shown a picture of the test chip that has been designed using a NOR type 0.18 µm flash embedded technology with 1.8V power supply, two poly, six metal and memory cell size of 0.35 µm$^2$. The test chip size is 8.4×4.8 mm$^2$.

TABLE I

TECHNOLOGY AND DEVICE PARAMETERS

| | |
|---|---|
| Process | 0.18 µm CMOS, two poly, six metal |
| Tunneling oxide | 10 nm |
| Cell size | 0.35 µm$^2$ |
| Organization | Four modules × 256 Kb × nine sectors |
| Memory module word | 128 bits |
| Supply voltage | 1.6 V–2.0 V |
| Program throughput | 1 MB/s |
| Sector erasing time | 200 ms |
| Access time | 40 ns |
| Peak read throughput | 1.2 GB/s |

From the previous description it may be appreciated that the memory architecture has a whole size of 8 Mb application-specific embeddable flash memory cells and comprises three content-specific I/O ports that can deliver a peak read throughput of 1.2 GB/s for non-volatile storage of code, data and embedded FPGA bit stream configurations.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An embeddable flash memory system for non-volatile storage of code, data, and bit-streams for embedded FPGA configurations and having a modular memory array structure with N memory blocks or modules, wherein a power block, including charge pumps, is shared among different flash memory modules through a power management arbiter (PMA) block, the system comprising a single chip on which the system is integrated together with a microprocessor, said PMA block including an order block configured to order requests for the memory blocks according to a status of the request (already active or new request) and priority information.

2. The embeddable flash memory system of claim 1, comprising three different access ports, each for a specific function:
 a code port to manage application code and optimized for random access time and the application system;
 a data port to manage application data and for access to modify application data; and,
 a floating programmable gate array (FPGA) port to manage embedded FPGA (e-FPGA) and offering a serial access for a fast download of bit streams for embedded FPGA configurations.

3. The embeddable flash memory system of claim 1, comprising a switch block managing the requests of the memory blocks based on the output of said order block; a request decoder block configured to enable the required high voltage resources while a corresponding pump driver block manages a power down/stand-by timeout and limits requests for each resource to a maximum allowed.

4. The embeddable flash memory system of claim 2 wherein said code port comprises four configuration registers defining its addressable memory space: two at the application level, and two at the flash memory modules level.

5. The embeddable flash memory system of claim 2 wherein said second data port manages application data stored in the memory blocks using an SRAM page buffer configured to enable the application to exchange data in burst mode at maximum speed to increase performance during write operation.

6. The embeddable flash memory system of claim 2 wherein said third port comprises four configuration registers replicating information stored in said code port that is used to write e-FPGA configurations data.

7. The embeddable flash memory system of claim 2 wherein said third port uses a chip select to access addressable memory space and a burst enable to enable burst serial access.

8. The embeddable flash memory system of claim 1 wherein a testability circuits (DFT) block is provided and connected to all relevant internal signals for first internal testing and then all internally generated voltages and currents system testability; said DFT block coupled to an external high voltage power supply, and two analog input-output (IO) pads configured to provide access from external test equipment.

9. An embeddable flash memory system, comprising a non-volatile memory for non-volatile storage of code, data, and bit-streams for embedded floating programmable gate array (FPGA) configurations, the system integrated into a single chip together with a microprocessor and having a modular array structure comprising a plurality of memory blocks, wherein a power block comprising charge pumps is shared among different flash memory modules through a power management arbiter (PMA), the PMA block having an order block configured to order requests for the memory blocks in accordance with status of the request (already active or new request) and priority information; and the system further including a switch block managing the requests of the memory blocks based on the output of the order block; a request decoder block configured to enable the required high voltage resources while a corresponding pump driver block manages a power down/stand-by timeout and limits requests for each resource to a maximum allowed.

10. The embeddable flash memory system of claim 9, comprising three different access ports, each for a specific function:
 a code port optimized for random access time and the application system;
 a data port for access to modify application data; and,
 an FPGA port offering a serial access for a fast download of bit streams for embedded FPGA configurations, wherein the code port comprises four configuration registers defining its addressable memory space: two at the application level, and two at the flash memory modules level.

11. The embeddable flash memory system of claim 10 wherein the code port comprises four configuration registers defining its addressable memory space: two at the application level, and two at the flash memory modules level.

12. The embeddable flash memory system of claim 10 wherein the data port manages application data stored in the memory blocks using an SRAM page buffer configured to enable the application to exchange data in burst mode at maximum speed to increase performance during write operation.

13. The embeddable flash memory system of claim 10 wherein the FPGA port comprises four configuration registers replicating information stored in the code port that is used to write e-FPGA configurations data.

14. The embeddable flash memory system of claim 10 wherein the FPGA port uses a chip select to access addressable memory space and a burst enable to enable burst serial access.

15. The embeddable flash memory system of claim 9 wherein a testability circuits (DFT) block connected to all relevant internal signals for first internal testing and then all internally generated voltages and currents system testability; the DFT block coupled to an external high voltage power supply, and two analog input-output (IO) pads configured to provide access from external test equipment.

* * * * *